US010469048B2

(12) United States Patent
Lim

(10) Patent No.: US 10,469,048 B2
(45) Date of Patent: Nov. 5, 2019

(54) SYSTEM, SOUND PROCESSING APPARATUS AND SOUND PROCESSING METHOD FOR ELECTRONIC GAMES

(75) Inventor: Wei Peng Renny Lim, Singapore (SG)

(73) Assignee: Creative Technology Ltd, Singapore (SG)

( * ) Notice: Subject to any disclaimer, the term of this patent is extended or adjusted under 35 U.S.C. 154(b) by 377 days.

(21) Appl. No.: 14/241,727

(22) PCT Filed: Jul. 20, 2012

(86) PCT No.: PCT/SG2012/000261
§ 371 (c)(1),
(2), (4) Date: Feb. 27, 2014

(87) PCT Pub. No.: WO2013/032403
PCT Pub. Date: Mar. 7, 2013

(65) Prior Publication Data
US 2014/0194205 A1    Jul. 10, 2014

(30) Foreign Application Priority Data
Aug. 29, 2011    (SG) .................................. 201106238

(51) Int. Cl.
*H03G 5/00*   (2006.01)
*H03G 5/16*   (2006.01)
*A63F 13/54*  (2014.01)

(52) U.S. Cl.
CPC ............. *H03G 5/005* (2013.01); *A63F 13/54* (2014.09); *H03G 5/165* (2013.01)

(58) Field of Classification Search
CPC ....... A63F 13/215; A63F 13/54; H03G 5/005; H03G 5/165; H03G 9/005; H03G 9/025; H04S 1/00
(Continued)

(56) References Cited

U.S. PATENT DOCUMENTS 5,550,925 A    8/1996   Hori et al.
6,075,868 A *  6/2000   Goldfarb et al. ............. 381/301
(Continued)

FOREIGN PATENT DOCUMENTS

EP    2410764 A1    1/2012
JP    H08243254 A   9/1996
(Continued)

*Primary Examiner* — David Duffy
*Assistant Examiner* — Ankit B Doshi
(74) *Attorney, Agent, or Firm* — Russell Swerdon; Desmund Gean

(57) ABSTRACT

A system, a sound processing method and a sound processing apparatus suitable for enhancing gamer experience for electronic games. The sound processing apparatus can communicate with a terminal suitable for playing an electronic game. The electronic game can be associated with audio data which can be communicated from the terminal to the sound processing apparatus. The sound processing apparatus includes a receive module for receiving the audio data and a processing module coupled to the receive module. The audio data can include low frequency range audio signals, mid frequency range audio signals and high frequency range audio signals. The audio data can be communicated from the receive module to the processing module. The processing module can be configured to process the audio data in a manner such that at least one of the low frequency range audio signals and the high frequency range audio signals are accentuated relative to the mid frequency range audio signals.

20 Claims, 4 Drawing Sheets

(58) Field of Classification Search
USPC .......................................... 463/30, 32, 35, 36
See application file for complete search history.

(56) References Cited

U.S. PATENT DOCUMENTS

| | | | |
|---|---|---|---|
| 7,928,310 B2 | 4/2011 | Georges et al. | |
| 8,491,386 B2 | 7/2013 | Reiss et al. | |
| 2005/0090295 A1 | 4/2005 | Ali et al. | |
| 2009/0028360 A1* | 1/2009 | Griesinger | H04S 3/02 |
| | | | 381/119 |

FOREIGN PATENT DOCUMENTS

| | | |
|---|---|---|
| JP | 2003-244797 A | 8/2003 |
| JP | 2005-046270 A | 2/2005 |

\* cited by examiner

SYSTEM, SOUND PROCESSING APPARATUS AND SOUND PROCESSING METHOD FOR ELECTRONIC GAMES

FIELD OF INVENTION

The present disclosure generally relates to signal processing of audio signals. More particularly, various embodiments of the disclosure relate to a sound processing apparatus and a sound processing method suitable for enhancing gamer experience for electronic games.

BACKGROUND

Electronic games have become popular sources of entertainment over the years. It is therefore desirable to enhance gamer experience during game play. Conventional techniques to enhance gamer experience during game play include enhancing game visuals and enhancing audio aspects of electronic games.

In one example, game visuals of electronic games such as animation graphics can be enhanced such that they are more aesthetically appealing. In another example, with regard to the audio aspects of electronic games, audio effects can be incorporated during game play. Examples of audio effects can include soundtracks, sound effects or background music.

Unfortunately conventional techniques fail to enhance gamer experience in a manner such that a gamer can have a more realistic game play experience. For example, whilst incorporating audio effects such as soundtracks and/or background music may provide some entertainment during game play, such audio effects may not necessarily provide a gamer with a realistic game play experience.

It is therefore desirable to provide a solution to address at least one of the foregoing problems of conventional techniques.

SUMMARY OF THE INVENTION

In accordance with an aspect of the disclosure, a sound processing apparatus is provided. The sound processing apparatus can communicate with a terminal suitable for playing an electronic game. The electronic game can be associated with audio data which can be communicated from the terminal to the sound processing apparatus. The sound processing apparatus includes a receive module and a processing module. The processing module can be coupled to the receive module.

The receive module can be configured for receiving the audio data. The audio data can include low frequency range audio signals, mid frequency range audio signals and high frequency range audio signals. The audio data can be communicated from the receive module to the processing module.

The processing module can be configured to process the audio data in a manner such that at least one of the low frequency range audio signals and the high frequency range audio signals are accentuated relative to the mid frequency range audio signals.

Preferably, the processing module can be configured to process the audio data such that the mid frequency range audio signals are attenuated relative to the low frequency range audio signals and the high frequency range audio signals. The processing module can be further configured to process the audio data in a manner such that the low frequency range audio signals are more amplified compared to the high frequency range audio signals.

Moreover, the sound processing apparatus can be configured to process the audio data based on at least one control scheme. The at least one control scheme can be used to determine whether or not the sound processing apparatus is activated to process the audio data.

The at least one control scheme can be at least one of an automatic based control scheme, a manual activation based control scheme and an audio activation based control scheme.

BRIEF DESCRIPTION OF THE DRAWINGS

Embodiments of the disclosure are described hereinafter with reference to the following drawings, in which.

DETAILED DESCRIPTION

Representative embodiments of the disclosure, for addressing one or more of the foregoing problems associated with conventional techniques, are described hereinafter with reference to FIG. 1 to FIG. 4.

Figure 1:
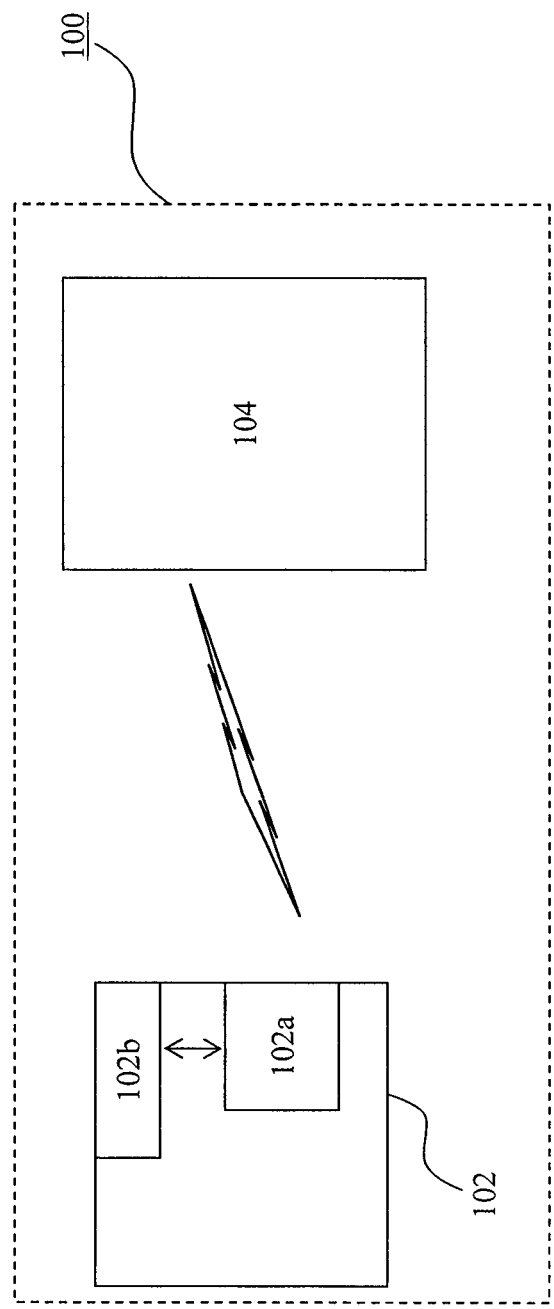
FIG. 1 shows a system which includes a terminal and a sound processing apparatus, according to an embodiment of the disclosure.

A system 100, in accordance with an embodiment of the disclosure, which includes a terminal 102 and a sound processing apparatus 104, is shown in FIG. 1. The terminal 102 and the sound processing apparatus 104 can be coupled to each other via one or both of wired coupling and wireless coupling. Specifically, via one or both of wired coupling and wireless coupling, the terminal 102 and the sound processing apparatus 104 can be configured to signal/data communicate with each other. For example, audio data can be signal/data communicated between the terminal 102 and the sound processing apparatus 104.

The terminal 102 can, for example, be an electronic device such as a desktop computer, a portable computer or an electronic tablet device suitable for use by one or more gamers for playing electronic games. An electronic game played on the terminal 102 can be associated with game data. The terminal 102 can include a sound module 102a. The terminal 102 can further include a sound reproduction module 102b. The sound module 102a and the sound reproduction module 102b can be coupled to each other.

The sound module 102a can be capable of processing game data in a manner so as to produce gaming audio signals. In this regard, the gaming audio signals can be associated with an electronic game played on the terminal 102. Additionally, the gaming audio signals can correspond to the aforementioned audio data. In this regard, an electronic game played on the terminal 102 can also be associated with audio data. The sound module 102a can, for example, be a sound card or an audio card. The sound module 102a can be configured to communicate the gaming audio signals to one or both of the sound reproduction module 102b and the sound processing apparatus 104.

The sound reproduction module 102b can be configured to receive gaming audio signals from the sound module 102a in a manner so as to output the gaming audio signals, thus enabling a gamer to hear the gaming audio signals. The sound reproduction module 102b can, for example, be a speaker.

As mentioned, the sound module 102a can be configured to communicate gaming audio signals, corresponding to audio data, to the sound processing apparatus 104. The sound processing apparatus 104 can be configured to receive and process the audio data in a manner, as will be discussed in further detail with reference to FIG. 2, so as to produce processed audio signals. Moreover, as will also be discussed in further detail with reference to FIG. 2, the sound processing apparatus 104 can be configured to process the audio data based on one or more control schemes.

In one embodiment, the sound processing apparatus 104 can be configured to output the processed audio signals in a manner so as to enable a gamer to hear the processed audio signals. In another embodiment, the sound processing apparatus 104 can be configured to communicate the processed audio signals to the terminal 102 such that the processed audio signals can be output by the sound reproduction module 102b in a manner so as to enable a gamer to hear the processed audio signals. In yet another embodiment, the sound processing apparatus 104 can be configured to output the processed audio signals and communicate the processed audio signals to the terminal 102.

Figure 2:
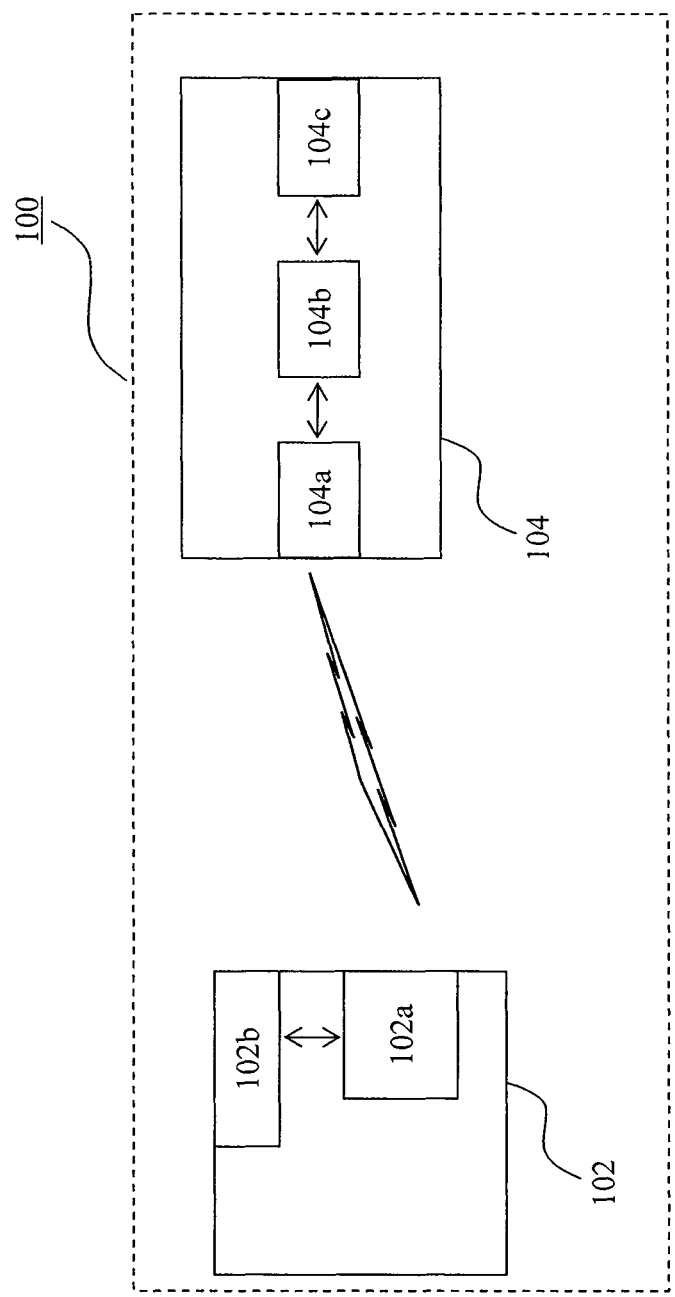
FIG. 2 shows that the sound processing apparatus of FIG. 1 can include a receive module, a processing module and an output module, according to an embodiment of the disclosure.

Referring to FIG. 2, the sound processing apparatus 104 can include a receive module 104a, a processing module 104b and an output module 104c. The receive module 104a can be configured to signal/data communicate with the terminal 102 in a manner so as to receive audio data. Specifically, the receive module 104a can be coupled to the sound module 102a and audio data can be communicated from the sound module 102a to the receive module 104a. The receive module 104a can be coupled to the processing module 104b in a manner such that audio data can be communicated from the receive module 104a to the processing module 104b. The processing module 104b can be configured to process the audio data in a manner so as to produce processed audio signals. The processing module 104b can be coupled to the output module 104c in a manner such that the processed audio signals can be communicated from the processing module 104b to the output module 104c.

The receive module 104a can, for example, be a transceiver which can be configured for one or both of wired communication and wireless communication with the sound module 102a. In this regard, the sound module 102a can, for example, include a corresponding transceiver (not shown) which can be configured to signal/data communicate with the receive module 104a.

The processing module 104b can, for example, be an audio processing capable integrated circuit (IC), a microprocessor or a digital signal processor (DSP). As mentioned earlier, the processing module 104b can be configured to process audio data in a manner so as to produce processed audio signals. Processing of audio data by the processing module 104b to produce audio signals will be discussed in further detail hereinafter.

Audio data received by the processing module 140b can include low frequency range audio signals, mid frequency range audio signals and high frequency range audio signals. Low frequency range audio signals can, for example, correspond to audio signals associated with frequencies substantially equal to, or below, 150 Hz. Mid frequency range audio signals can, for example, correspond to audio signals associated with frequencies between 800 Hz and 1 KHz. High frequency range audio signals can, for example, correspond to audio signals associated with frequencies between 2 KHz and 16 KHz.

The processing module 104b can, for example, be configured to process audio data based on one or both of smart volume management (SVM) based techniques and custom tuned audio equalization (EQ) based techniques. With regard to SVM, any one of the low frequency range audio signals, mid frequency range audio signals and high frequency range audio signals, or any combination thereof, can, for example, be boosted if amplitude/power/energy characteristics of the audio signals are undesirably low/weak. Alternatively, if desired, SVM can also be used for attenuation of audio signals. SVM can be associated with volume normalization. Similarly, custom tuned audio EQ can also be utilized to boost and/or attenuate any one of the low frequency range audio signals, mid frequency range audio signals and high frequency range audio signals, or any combination thereof.

In one exemplary scenario, the processing module 140b can process the audio data in a manner such that low frequency range audio signals are amplified or boosted. Additionally, the processing module 140b can process the audio data such that the mid frequency range audio signals can be attenuated relative to the low frequency range audio signals. Furthermore, the processing module 140b can process the audio data such that the high frequency range audio signals can be moderately amplified or boosted relative to mid frequency range audio signals. The amplification or boost of high frequency range audio signals should preferably not be higher than that for low frequency range audio signals.

In this regard, the processing module 140b can be configured to process audio data in a manner such that amplification or boost for low frequency range audio signals is higher compared to high frequency range audio signals. In addition, with the processing module 140b can be configured to process audio data in a manner such that mid frequency range audio signals are attenuated relative to one or both of the low frequency range audio signals and the high frequency range audio signals. Thus one or both of the low frequency range audio signals and the high frequency range audio signals can be accentuated relative to the mid frequency range audio signals. Preferably, the low frequency range audio signals are more accentuated compared to the high frequency range audio signals when both the low frequency range audio signals and the high frequency range audio signals are accentuated relative to the mid frequency range audio signals.

Preferably, the processing module 140b can be configured to process audio data in a manner so as to accentuate both of the low frequency range audio signals and the high frequency range audio signals relative to the mid frequency range audio signals. Additionally, the low frequency range audio signals are preferably more accentuated compared to the high frequency range audio signals.

Thus processed audio signals produced by the processing module 140b can be such that one or both of the low frequency range audio signals and the high frequency range audio signals are accentuated relative to the mid frequency range audio signals. The processed audio signals can further be such that the low frequency range audio signals are more accentuated compared to the high frequency range audio signals when both the low frequency range audio signals and the high frequency range audio signals are accentuated relative to the mid frequency range audio signals.

The output module 104c can, for example, be one or both of a transceiver, as discussed earlier with reference to the receiver module 104a, and a speaker, as discussed earlier with reference to the sound reproduction module 102b. In this regard, the foregoing discussion pertaining to the receiver module 104a and the sound reproduction module 102b, where appropriate, analogously applies to the output module 104c.

Additionally, earlier mentioned, the sound processing apparatus 104 can be configured to process the audio data based on one or more control schemes.

More specifically the sound processing apparatus 104 can be configured to process the audio data based on any one of a first control scheme, a second control scheme and a third control scheme, or any combination thereof.

The first control scheme can be associated with an automatic activation based control scheme. In particular, the sound processing apparatus 104 can be automatically activated to receive and/or process audio data communicated from the terminal 102 so as to produce processed audio signals.

For example, one or both of the terminal 102 and the sound processing apparatus 104 can further include a database (not shown). The database can include a games list. The games list can be a list of game titles. If an electronic game played on the terminal 102 corresponds to a game title in the list of game titles, a control signal can be generated so as to activate the sound processing apparatus 104 to receive and/or process audio data communicated from the terminal 102. The control signal can, in one example, be generated by the terminal 102 and communicated from the terminal 102 to the sound processing apparatus 104. The control signal can, in another example, be generated by the database. Conversely, if an electronic game played on the terminal 102 does not correspond to a game title in the list of game titles, the control signal is not generated. In the absence of a control signal, the sound processing apparatus 104 is not activated to receive and/or process audio data communicated from the terminal 102.

The second control scheme can be associated with a manual activation based control scheme. In particular, the sound processing apparatus 104 can be manually activated to receive and/or process audio data communicated from terminal 102 so as to produce processed audio signals.

In one example, a hardware based activation button (shown later with reference to FIG. 3) can be implemented at one or both of the terminal 102 and the sound processing apparatus 104. The activation button can, for example, be pressed by a gamer such that the aforementioned control signal can be generated to activate the sound processing apparatus 104 to receive and/or process audio data communicated from the terminal 102.

In another example, a software based activation button can be implemented at one or both of the terminal 102 and the sound processing apparatus 104. In one exemplary scenario, the software based activation button is implemented at the terminal 102. In this regard, the terminal 102 can include display (not shown) which can be a touch screen based display. The software based activation button can be in the form a graphics user interface (GUI). By contacting the appropriate portion of the display screen corresponding to the GUI, a control signal can be generated to activate the sound processing apparatus 104 to receive and/or process audio data communicated from the terminal 102.

The third control scheme can be an audio activation based control scheme. For example, the sound processing apparatus 104 can be voice activated to receive and/or process audio data communicated from terminal 102 so as to produce processed audio signals.

For example, a voice recognition module (not shown) can preferably be implemented at one or both of the terminal 102 and the sound processing apparatus 104. Alternatively the voice recognition module can be a module separate from the terminal 102 and sound processing apparatus 104. The voice recognition can be coupled to one or both of the terminal 102 and sound processing apparatus 104. The voice recognition module can, for example, be configured to learn and recognize a gamer's preferred word or phrase. If a gamer utters the preferred word or phrase, the voice recognition module can be configured to generate the control signal so as to activate the sound processing apparatus 104 to receive and/or process audio data communicated from the terminal 102.

In one exemplary application, the electronic game played on the terminal 102 can be a war related game. In this regard gaming audio signals produced by the sound module 102a can be associated with sound or audio cues such as footsteps, weapon reloading, ammunition discharge, explosions and ricochet. Gaming audio signals can be further associated with voice audio when a character of the game speaks during game play. Gaming audio signals can yet be further associated with other sounds such as background music or soundtrack.

Audio cues such as footsteps and explosions can be associated with low frequency range audio signals. Audio cues such as ammunition discharge and ricochet can be associated with high frequency range audio signals. The voice audio can be associated with mid frequency range audio signals.

For a gamer to have a more realistic gaming experience, it may be desired for the audio cues to be emphasized or accentuated relative to the voice audio and/or background music.

As mentioned earlier, the processing module 140b can be configured to process audio data in a manner such that amplification or boost for low frequency range audio signals is higher compared to high frequency range audio signals. In addition, with the processing module 140b can be configured to process audio data in a manner such that mid frequency range audio signals are attenuated relative to one or both of the low frequency range audio signals and the high frequency range audio signals. Thus one or both of the low frequency range audio signals and the high frequency range audio signals can be accentuated relative to the mid frequency range audio signals. Preferably, the low frequency range audio signals are more accentuated compared to the high frequency range audio signals when both the low frequency range audio signals and the high frequency range audio signals are accentuated relative to the mid frequency range audio signals.

In this regard, the processing module 140b can be configured to process audio data, corresponding to gaming audio signals, in a manner such that audio cues such as footsteps and explosions are higher amplified compared to audio cues such as ammunition discharge and ricochet. Furthermore, the processing module 140b can be configured to process audio data, corresponding to gaming audio signals, in a manner so as to attenuate voice audio and/or background music.

In this manner audio cues can be appropriately emphasized or accentuated relative to the voice audio and/or background music, thus providing a gamer with a more realistic gaming experience.

Figure 3:
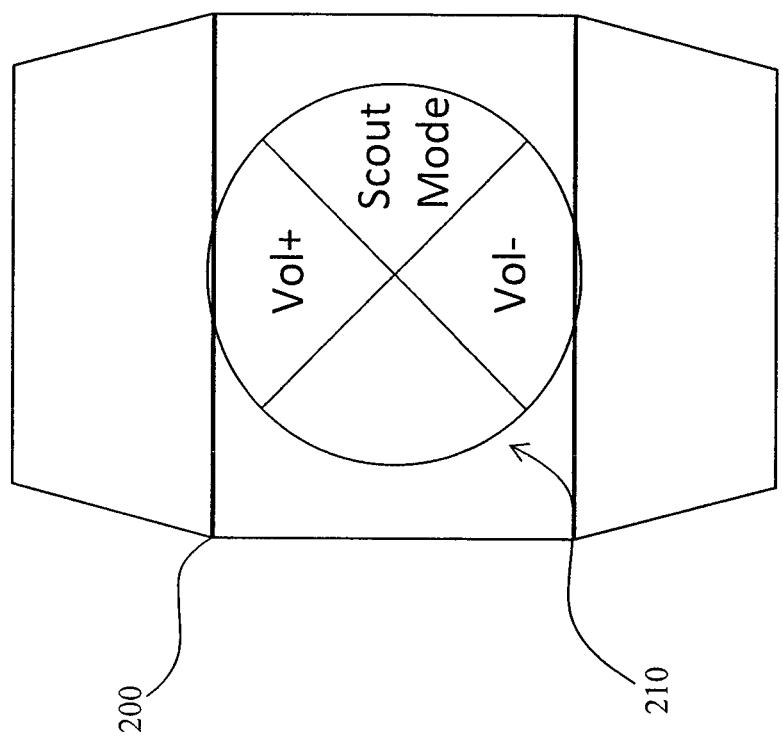
FIG. 3 shows a casing which can be configured to carry the receive module, the processing module and the output module of FIG. 2, according to an embodiment of the disclosure.

FIG. 3 shows a casing 200 which can be configured to carry the receive module 104a, the processing module 104b and the output module 104c. The casing 200 can include control buttons 210 such as the aforementioned hardware based activation button for generating the aforementioned control signal. Further shown in FIG. 3, the hardware based activation button for generating the control signal can be labeled as "Scout Mode".

Other control buttons, such as a first volume control button for increasing the volume of gaming audio signals and/or processed audio signals and a second volume control button for decreasing the volume of gaming audio signals and/or processed audio signals, can optionally be included. As shown in FIG. 3, the first volume control button can be labeled as "Vol +" and the second volume control button can be labeled as "Vol −".

Figure 4:
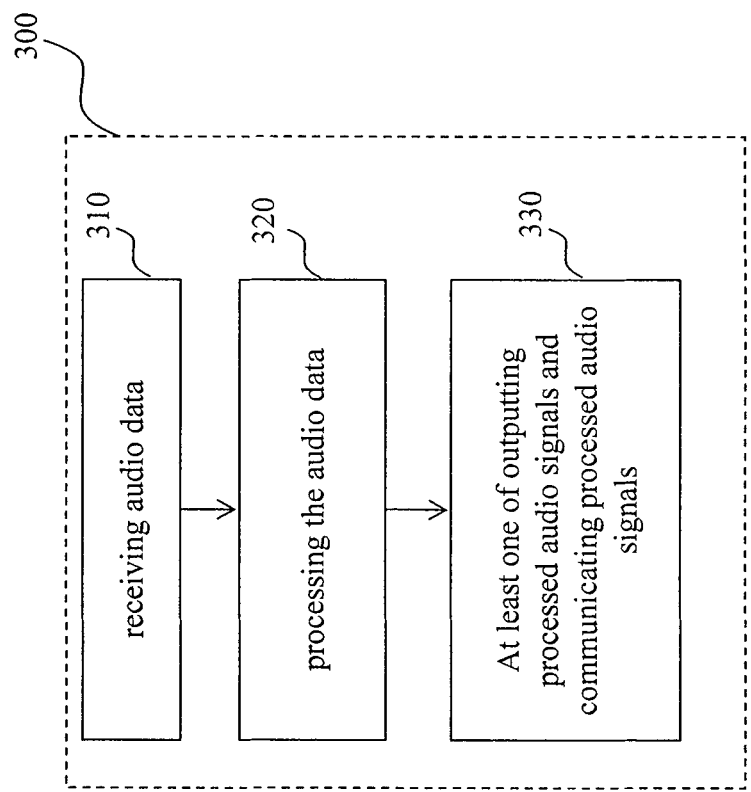
FIG. 4 is a flow diagram illustrating a sound processing method in association with the system of FIG. 1.

FIG. 4 shows a sound processing method 300 which can be implemented in association with the system 100.

The sound processing method 300 can include receiving audio data 310. Audio data, corresponding to gaming audio signals, can be communicated from the terminal 102 and received by the sound processing apparatus 104. More specifically, audio data can be communicated from the sound module 102a and received by the receive module 104a.

The sound processing method 300 can further include processing the audio data 320 to produce the processed audio signals. The audio data can be processed by the sound processing apparatus 104 to produce the processed audio signals. More specifically, audio data received by the receive module 104a can be communicated to the processing module 104b for processing to produce the processed audio signals.

Processed audio signals produced by the processing module 140b can be such that one or both of the low frequency range audio signals and the high frequency range audio signals are accentuated relative to the mid frequency range audio signals. The processed audio signals can further be such that the low frequency range audio signals are more accentuated compared to the high frequency range audio signals when both the low frequency range audio signals and the high frequency range audio signals are accentuated relative to the mid frequency range audio signals.

The sound processing method 300 can optionally include one or both of outputting the processed audio signals and communicating the processed audio signals 330.

In one embodiment, the sound processing apparatus 104 can be configured to output the processed audio signals in a manner so as to enable a gamer to hear the processed audio signals. In another embodiment, the sound processing apparatus 104 can be configured to communicate the processed audio signals to the terminal 102 such that the processed audio signals can be output by the sound reproduction module 102b in a manner so as to enable a gamer to hear the processed audio signals. In yet another embodiment, the sound processing apparatus 104 can be configured to output the processed audio signals and communicate the processed audio signals to the terminal 102.

In the foregoing manner, various embodiments of the disclosure are described for addressing at least one of the foregoing disadvantages. Such embodiments are intended to be encompassed by the following claims, and are not to be limited to specific forms or arrangements of parts so described and it will be apparent to one skilled in the art in view of this disclosure that numerous changes and/or modification can be made, which are also intended to be encompassed by the following claims.

The invention claimed is:

1. A sound processing apparatus communicable with a terminal having a first processor suitable for using with an electronic game, the electronic game being associable with audio data communicable from the terminal to the sound processing apparatus, the sound processing apparatus comprising:

a receive module for receiving the audio data via the first processor of the terminal, the audio data comprising low frequency range audio signals, mid frequency range audio signals and high frequency range audio signals, wherein the receive module is a transceiver; and a processing module having a second processor coupled to the receive module, the audio data being communicable from the receive module to the processing module, wherein the processing module is configurable to process via the second processor the audio data in a manner such that at least one of the low frequency range audio signals and the high frequency range audio signals are accentuated relative to the mid frequency range audio signals, wherein the electronic game being associable with the audio data is communicable from a sound card in the terminal to the sound processing apparatus, and wherein the sound processing apparatus supplements the sound card in the terminal when activated to process the audio data.

2. The sound processing apparatus as in claim 1 wherein the processing module is configurable to process the audio data in a manner so as to attenuate the mid frequency range audio signals relative to at least one of the low frequency range audio signals and the high frequency range audio signals.

3. The sound processing apparatus as in claim 2 wherein the processing module is further configurable to process the audio data in a manner such that the low frequency range audio signals are more amplified compared to the high frequency range audio signals.

4. The sound processing apparatus as in claim 1, wherein the processing module is configurable to process the audio data in a manner such that the mid frequency range audio signals are attenuated relative to the low frequency range audio signals and the high frequency range audio signals, and wherein the processing module is further configurable to process the audio data in a manner such that the low frequency range audio signals are more amplified compared to the high frequency range audio signals.

5. The sound processing apparatus as in claim 1, wherein the sound processing apparatus is configurable to process the audio data based on at least one control scheme, the at least one control scheme determining whether or not the sound processing apparatus is activated to process the audio data, the at least one control scheme being at least one of an automatic based control scheme, a manual activation based control scheme and an audio activation based control scheme.

6. The sound processing apparatus as in claim 5, wherein the automatic based control scheme comprises including a database in at least one of the terminal and the sound processing apparatus, the database comprising a games list having a list of game titles, wherein a control signal is generated if the electronic game played on the terminal corresponds to a game title in the list of game titles and the control signal is not generated otherwise, and wherein the sound processing apparatus is activated to process the audio data if the control signal is generated and the sound processing apparatus is not activated otherwise.

7. The sound processing apparatus as in claim 5,
wherein the manual activation based control scheme comprises implementing an activation button in at least one of the sound processing apparatus and the terminal, the activation button being usable to generate a control signal to activate the sound processing apparatus to process the audio data.

8. The sound processing apparatus as in claim 5,
wherein the audio activation based control scheme comprises having at least one of the first processor and the second processor programmed to provide voice recognition by recognizing one of a preferred word and a preferred phrase, and
wherein upon recognition of one of the preferred word and the preferred phrase, a control signal is generated by the at least one of the first processor and the second processor to activate the sound processing apparatus to process the audio data.

9. The sound processing apparatus as in claim 1,
wherein the audio data correspond to gaming audio signals associated with audio cues and at least one of voice audio and background music, and
wherein the audio cues are accentuated relative to the at least one of voice audio and background music.

10. The sound processing apparatus as in claim 1, wherein the first processor is integral to the sound card in the terminal.

11. A sound processing apparatus communicable with a terminal having a first processor suitable for using with an electronic game, the electronic game being associable with audio data communicable from the terminal to the sound processing apparatus, the sound processing apparatus comprising:
a receive module for receiving the audio data via the first processor of the terminal, the audio data comprising low frequency range audio signals, mid frequency range audio signals and high frequency range audio signals, wherein the receive module is a transceiver; and
a processing module having a second processor coupled to the receive module, the audio data being communicable from the receive module to the processing module,
wherein the processing module is configurable to process via the second processor the audio data in a manner such that the mid frequency range audio signals are attenuated relative to the low frequency range audio signals and the high frequency range audio signals,
wherein the processing module is further configurable to process via the second processor the audio data in a manner such that the low frequency range audio signals are more amplified compared to the high frequency range audio signals,
wherein the electronic game being associable with the audio data is communicable from a sound card in the terminal to the sound processing apparatus, and
wherein the sound processing apparatus supplements the sound card in the terminal when activated to process the audio data.

12. The sound processing apparatus as in claim 11,
wherein the sound processing apparatus is configurable to process the audio data based on at least one control scheme, the at least one control scheme determining whether or not the sound processing apparatus is activated to process the audio data, the at least one control scheme being at least one of an automatic based control scheme, a manual activation based control scheme and an audio activation based control scheme.

13. The sound processing apparatus as in claim 12,
wherein the automatic based control scheme comprises including a database in at least one of the terminal and the sound processing apparatus, the database comprising a games list having a list of game titles,
wherein a control signal is generated if the electronic game played on the terminal corresponds to a game title in the list of game titles and the control signal is not generated otherwise, and
wherein the sound processing apparatus is activated to process the audio data if the control signal is generated and the sound processing apparatus is not activated otherwise.

14. The sound processing apparatus as in claim 12,
wherein the manual activation based control scheme comprises implementing an activation button in at least one of the sound processing apparatus and the terminal, the activation button being usable to generate a control signal to activate the sound processing apparatus to process the audio data.

15. The sound processing apparatus as in claim 12,
wherein the audio activation based control scheme comprises having at least one of the first processor and the second processor programmed to provide voice recognition by recognizing
one of a preferred word and a preferred phrase, and
wherein upon recognition of one of the preferred word and the preferred phrase, a control signal is generated by the at least one of the first processor and the second processor to activate the sound processing apparatus to process the audio data.

16. A sound processing apparatus communicable with a terminal having a first processor suitable for using with an electronic game, the electronic game being associable with audio data communicable from the terminal to the sound processing apparatus, the sound processing apparatus comprising:
a receive module for receiving the audio data via the first processor of the terminal, the audio data comprising low frequency range audio signals, mid frequency range audio signals and high frequency range audio signals, wherein the receive module is a transceiver; and
a processing module having a second processor coupled to the receive module, the audio data being communicable from the receive module to the processing module,
wherein the processing module is configurable to process the audio data in a manner so as to attenuate the mid frequency range audio signals relative to at least one of the low frequency range audio signals and the high frequency range audio signals,
wherein the electronic game being associable with the audio data is communicable from a sound card in the terminal to the sound processing apparatus, and
wherein the sound processing apparatus supplements the sound card in the terminal when activated to process the audio data.

17. The sound processing apparatus as in claim 16,
wherein the sound processing apparatus is configurable to process the audio data based on at least one control scheme, the at least one control scheme determining whether or not the sound processing apparatus is activated to process the audio data, the at least one control scheme being at least one of an automatic based control scheme, a manual activation based control scheme and an audio activation based control scheme.

18. The sound processing apparatus as in claim 17,
wherein the automatic based control scheme comprises including a database in at least one of the terminal and the sound processing apparatus, the database comprising a games list having a list of game titles,
wherein a control signal is generated if the electronic game played on the terminal corresponds to a game title in the list of game titles and the control signal is not generated otherwise, and
wherein the sound processing apparatus is activated to process the audio data if the control signal is generated and the sound processing apparatus is not activated otherwise.

19. The sound processing apparatus as in claim 17,
wherein the manual activation based control scheme comprises implementing an activation button in at least one of the sound processing apparatus and the terminal, the activation button being usable to generate a control signal to activate the sound processing apparatus to process the audio data.

20. The sound processing apparatus as in claim 17,
wherein the audio activation based control scheme comprises having at least one of the first processor and the second processor programmed to provide voice recognition by recognizing
one of a preferred word and a preferred phrase, and
wherein upon recognition of one of the preferred word and the preferred phrase, a control signal is generated by the at least one of the first processor and the second processor to activate the sound processing apparatus to process the audio data.

* * * * *